(12) United States Patent
Park

(10) Patent No.: US 11,227,858 B2
(45) Date of Patent: Jan. 18, 2022

(54) SEMICONDUCTOR PACKAGE INCLUDING STACKED SEMICONDUCTOR CHIPS

(71) Applicant: SK hynix Inc., Icheon-si (KR)

(72) Inventor: Jinkyoung Park, Suwon-si (KR)

(73) Assignee: SK hynix Inc., Icheon-si (KR)

( * ) Notice: Subject to any disclaimer, the term of this patent is extended or adjusted under 35 U.S.C. 154(b) by 11 days.

(21) Appl. No.: 16/901,891

(22) Filed: Jun. 15, 2020

(65) Prior Publication Data
US 2021/0183815 A1 Jun. 17, 2021

(30) Foreign Application Priority Data

Dec. 17, 2019 (KR) .......................... 10-2019-0168772

(51) Int. Cl.
H01L 25/065 (2006.01)
H01L 23/538 (2006.01)
(52) U.S. Cl.
CPC ...... H01L 25/0657 (2013.01); H01L 23/5385 (2013.01); H01L 23/5386 (2013.01)
(58) Field of Classification Search
None
See application file for complete search history.

(56) References Cited

U.S. PATENT DOCUMENTS

| 8,716,854 | B2* | 5/2014 | Kim | .................. | H01L 25/0657 |
| | | | | | 257/686 |
| 10,741,498 | B2* | 8/2020 | Heo | .................. | H01L 23/5386 |
| 10,804,209 | B2* | 10/2020 | Kang | .................. | H01L 23/16 |
| 10,861,812 | B2* | 12/2020 | Aoki | .................. | H01L 25/18 |
| 2010/0193930 | A1* | 8/2010 | Lee | .................. | H01L 23/5389 |
| | | | | | 257/686 |
| 2010/0283140 | A1* | 11/2010 | Kim | .................. | H01L 23/49811 |
| | | | | | 257/686 |
| 2011/0175222 | A1* | 7/2011 | Kim | .................. | H01L 25/0657 |
| | | | | | 257/738 |
| 2011/0291244 | A1* | 12/2011 | Takeshima | .................. | H01L 21/565 |
| | | | | | 257/618 |

(Continued)

FOREIGN PATENT DOCUMENTS

KR 1020180052351 A 5/2018

Primary Examiner — Zandra V Smith
Assistant Examiner — Lawrence C Tynes, Jr.
(74) Attorney, Agent, or Firm — William Park & Associates Ltd.

(57) ABSTRACT

A semiconductor package includes: a substrate having first substrate pads formed at one side edge thereof in a first direction and second substrate pads formed at an other side edge thereof in the first direction; a sub semiconductor package formed on the substrate, and including a sub semiconductor chip, a sub molding layer which surrounds side surfaces of the sub semiconductor chip and redistribution conductive layers which extend onto the sub molding layer while being connected with sub chip pads of the sub semiconductor chip and are connected to first redistribution pads and second redistribution pads formed at one side edge and the other side edge, respectively, of the sub molding layer in the first direction; a first chip stack formed on the sub semiconductor package, and including first main semiconductor chips; and a second chip stack formed on the first chip stack, and including second main semiconductor chips.

21 Claims, 10 Drawing Sheets

(56) References Cited

U.S. PATENT DOCUMENTS

| | | | |
|---|---|---|---|
| 2013/0056867 A1* | 3/2013 | Pagaila | H01L 21/565 257/737 |
| 2015/0221587 A1* | 8/2015 | Kindo | H01L 23/3128 257/737 |
| 2018/0026022 A1* | 1/2018 | Lee | H01L 25/0652 257/659 |
| 2018/0240782 A1* | 8/2018 | Watanabe | H01L 25/50 |
| 2018/0294251 A1* | 10/2018 | Liu | H01L 23/49833 |
| 2019/0287939 A1* | 9/2019 | Takemoto | H01L 25/50 |
| 2020/0013767 A1* | 1/2020 | Baik | H01L 23/147 |
| 2020/0118901 A1* | 4/2020 | Cai | H01L 21/0273 |

* cited by examiner

SEMICONDUCTOR PACKAGE INCLUDING STACKED SEMICONDUCTOR CHIPS

CROSS-REFERENCE TO RELATED APPLICATION

This application claims priority under 35 U.S.C. § 119 to Korean Patent Application No. 10-2019-0168772 filed on Dec. 17, 2019, which is incorporated herein by reference in its entirety.

BACKGROUND

1. Technical Field

This patent document relates to a semiconductor package, and more particularly, to a semiconductor package in which a plurality of chips are stacked on a substrate.

2. Related Art

Electronic products are increasingly required to process large amounts of data even while being decreased in volume. Accordingly, there is a growing need to increase the degree of integration of semiconductor devices used in such electronic products.

However, due to a limitation in semiconductor integration technology, it is difficult to satisfy required functions with only a single semiconductor chip, and thus, semiconductor packages are manufactured in which a plurality of semiconductor chips are embedded in one semiconductor package.

Even though the semiconductor packages include a plurality of semiconductor chips, the semiconductor packages are required to be fabricated to have a designated size depending on a requirement of an application for which the semiconductor package is used.

SUMMARY

In an embodiment, a semiconductor package may include: a substrate having first substrate pads formed at one side edge thereof in a first direction and second substrate pads formed at an other side edge thereof in the first direction; a sub semiconductor package formed on the substrate, the sub semiconductor package including a sub semiconductor chip, a sub molding layer which surrounds side surfaces of the sub semiconductor chip and redistribution conductive layers which extend onto the sub molding layer while being connected with sub chip pads of the sub semiconductor chip and are connected to first redistribution pads and second redistribution pads formed at one side edge and the other side edge, respectively, of the sub molding layer in the first direction; a first chip stack formed on the sub semiconductor package, the first chip stack including one or more first main semiconductor chips; and a second chip stack formed on the first chip stack, the second chip stack including one or more second main semiconductor chips, wherein the sub semiconductor chip is connected to the substrate by first sub package interconnectors which connect the first redistribution pads and the first substrate pads and second sub package interconnectors, which connect the second redistribution pads and the second substrate pads, wherein the first chip stack is connected to the substrate by first interconnectors, which connect first chip pads of the one or more first main semiconductor chips and the first substrate pads, and wherein the second chip stack is connected to the substrate by second interconnectors which connect second chip pads of the one or more second main semiconductor chips and the second substrate pads.

In an embodiment, a semiconductor package may include: a substrate having first substrate pads formed at one side edge thereof in a first direction and second substrate pads formed at an other side edge thereof in the first direction; a sub semiconductor package formed on the substrate, the sub semiconductor package including a sub semiconductor chip, a sub molding layer which surrounds side surfaces of the sub semiconductor chip, and redistribution conductive layers which extend onto the sub molding layer while being connected with sub chip pads of the sub semiconductor chip and are connected to first redistribution pads and second redistribution pads formed at one side edge and the other side edge, respectively, of the sub molding layer in the first direction; and a chip stack formed on the sub semiconductor package, the chip stack including one or more main semiconductor chips, wherein the sub chip pads include first sub chip pads and third sub chip pads which are disposed at both side edges, respectively, of the sub semiconductor chip in the first direction, and second sub chip pads and fourth sub chip pads which are disposed at both side edges, respectively, of the sub semiconductor chip in a second direction perpendicular to the first direction, wherein the redistribution conductive layers which are connected with the first sub chip pads and the second sub chip pads extend to the first redistribution pads, and wherein the redistribution conductive layers which are connected with the third sub chip pads and the fourth sub chip pads extend to the second redistribution pads.

DETAILED DESCRIPTION

Figure 1:
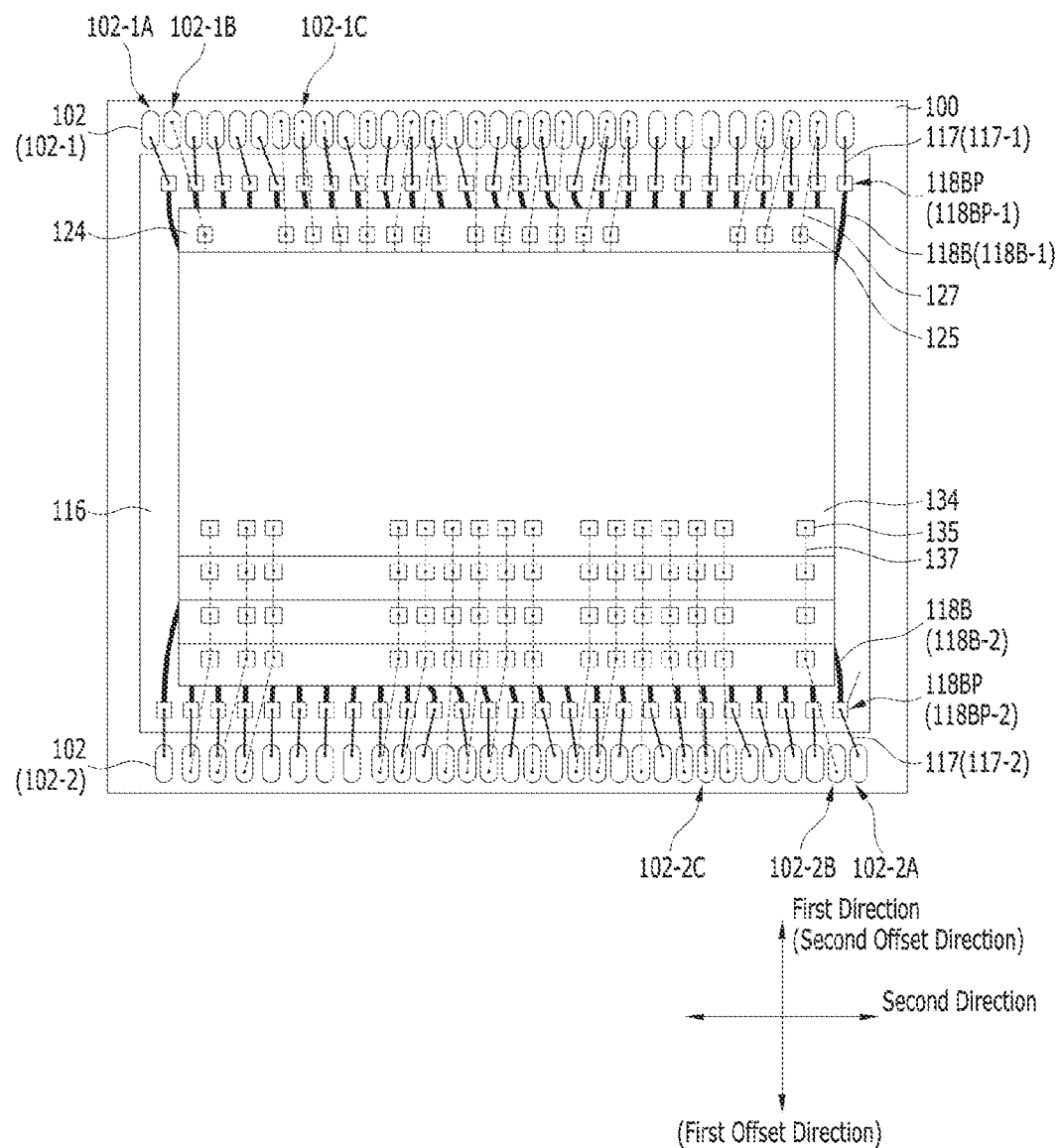
FIG. 1 is a planar view illustrating a semiconductor package in accordance with an embodiment of the present disclosure.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Various embodiments are directed to a semiconductor package capable of realizing a semiconductor package in which a main semiconductor chip is disposed on a sub semiconductor chip and securing operation characteristics.

Figure 2:
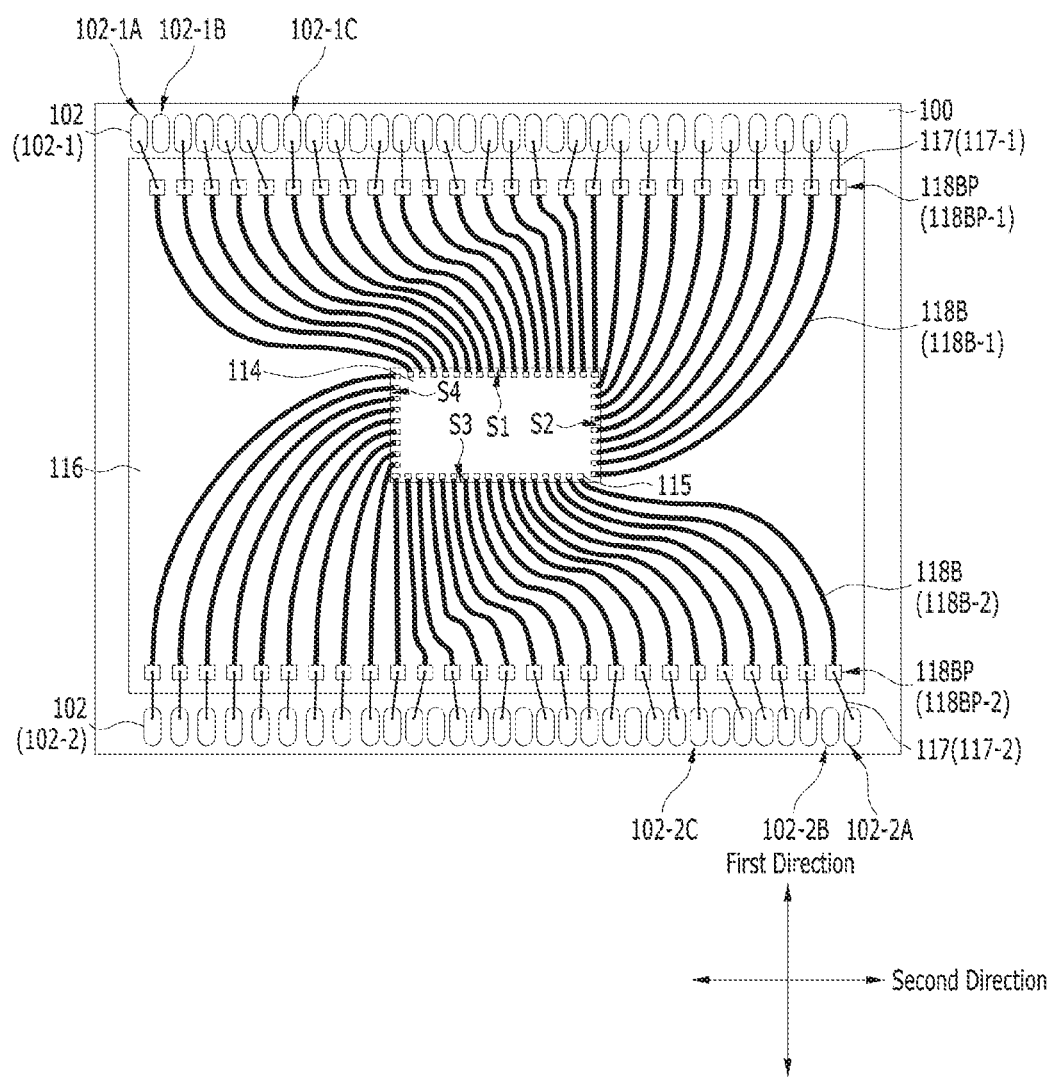
FIG. 2 is a planar view illustrating a part of the semiconductor package illustrated in FIG. 1, with a first chip stack, a second chip stack, and interconnectors connected with the first and second chip stacks omitted.
Figure 3:
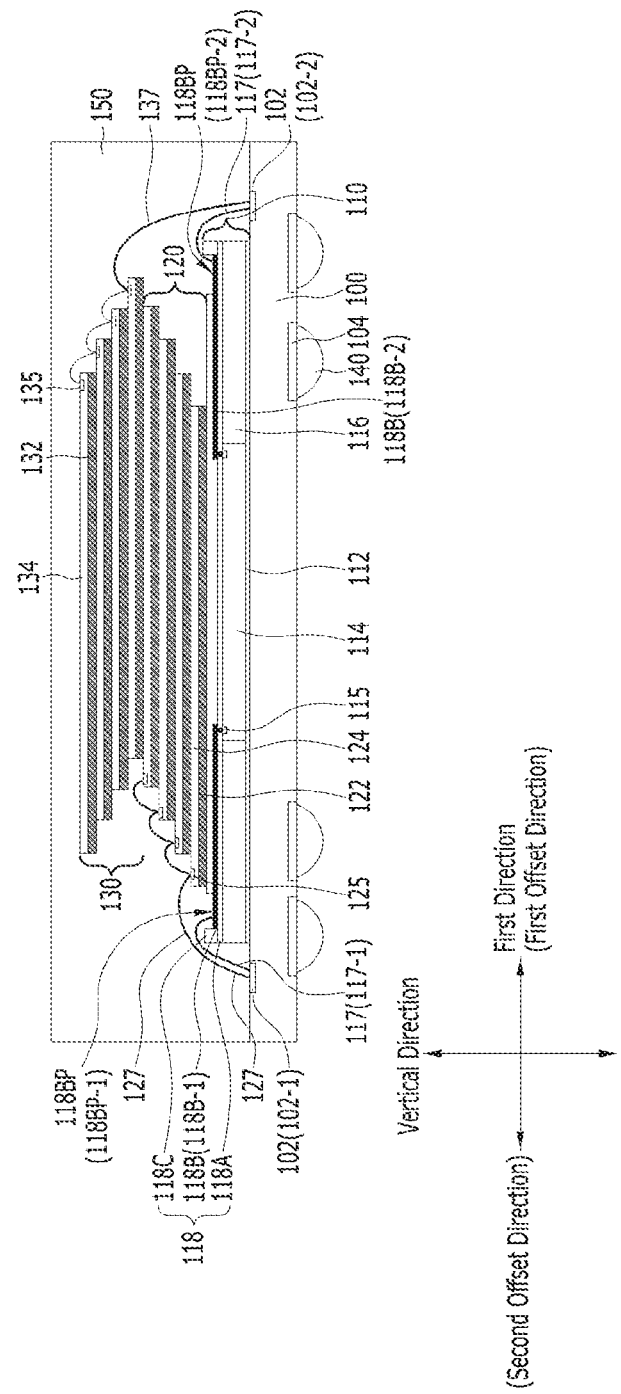
FIG. 3 is a cross-sectional view illustrating the semiconductor package illustrated in FIG. 1.

FIG. 1 is a planar view illustrating a semiconductor package in accordance with an embodiment of the present disclosure. FIG. 2 is a planar view illustrating a part of the semiconductor package illustrated in FIG. 1, with a first chip stack, a second chip stack, and interconnectors connected with the first and second chip stacks omitted. FIG. 3 is a cross-sectional view illustrating the semiconductor package illustrated in FIG. 1. FIGS. 1 and 2 are top views of the semiconductor package and the part thereof, respectively, in accordance with the present embodiment. FIG. 3 illustrates a cross-section taken along a line passing through the reference symbols 102-1C, 118B-1, 118B-2 and 102-2C of FIG. 1.

Referring to FIGS. 1 to 3, the semiconductor package may include a substrate 100, a sub semiconductor package 110 which is disposed on the substrate 100, and first and second chip stacks 120 and 130 which are disposed on the sub semiconductor package 110.

The substrate 100 may be a substrate for a semiconductor package, which has a circuit and/or wiring structure to transfer electrical signals, such as a printed circuit board (PCB).

The substrate 100 may have a top surface on which the sub semiconductor package 110, the first chip stack 120, and the second chip stack 130 may be disposed, and a bottom surface which faces away from the top surface and on which external connection terminals 140 for connecting the semiconductor package with the outside may be disposed. For reference, the top surface and the bottom surface to be described below are expressions to indicate relative positions of various surfaces of a component, and do not indicate absolute positions. For example, in the case where the semiconductor package is turned upside down unlike the illustration, a surface on which the sub semiconductor package 110 and the first and second chip stacks 120 and 130 are disposed may be the bottom surface of the substrate 100 and a surface on which the external connection terminals 140 are disposed may be the top surface of the substrate 100.

The substrate 100 may include top surface substrate pads 102 and bottom surface substrate pads 104. The top surface substrate pads 102 may be disposed on the top surface of the substrate 100 to electrically connect the sub semiconductor package 110, the first chip stack 120, and the second chip stack 130 with the substrate 100. The bottom surface substrate pads 104 may be disposed on the bottom surface of the substrate 100 to electrically connect the external connection terminals 140 with the substrate 100. For reference, substrate pads may mean electrically conductive elements or terminals which are exposed on the surfaces of the substrate 100 to electrically connect the substrate 100 with other components. As an example, the top surface substrate pads 102 may be bond fingers for wire bonding, and the bottom surface substrate pads 104 may be ball lands for bonding with solder balls. The top surface substrate pads 102 and the bottom surface substrate pads 104 may be connected with a circuit and/or wiring structure inside the substrate 100.

The top surface substrate pads 102 may be disposed at both side edges of the substrate 100 which do not overlap with the sub semiconductor package 110, for example, both side edges of the substrate 100 in a first direction. The top surface substrate pads 102 which are disposed at one side edge of the substrate 100 in the first direction may be referred to as first top surface substrate pads 102-1, and the top surface substrate pads 102 which are disposed at the other side edge of the substrate 100 in the first direction may be referred to as second top surface substrate pads 102-2. For reference, one side in the first direction to be described below may correspond to an upper side in FIGS. 1 and 2 and may correspond to a left side in FIG. 3, and the other side in the first direction to be described below may correspond to a lower side in FIGS. 1 and 2 and may correspond to a right side in FIG. 3. In the present embodiment, the plurality of first top surface substrate pads 102-1 and the plurality of second top surface substrate pads 102-2 may be arranged in a line, respectively, in a second direction intersecting with the first direction. However, it is to be noted that the present disclosure is not limited thereto, and the numbers, arrangements, and so forth of the first and second top surface substrate pads 102-1 and 102-2 at both the side edges of the substrate 100, respectively, may be variously changed.

Some (see the reference symbol 102-1A) among the plurality of first top surface substrate pads 102-1 may be connected to a sub semiconductor chip 114 which will be described later, and hereinafter, will be referred to as first sub pads 102-1A. Others (see the reference symbol 102-1B) among the plurality of first top surface substrate pads 102-1 may be connected to a first main semiconductor chip 124 which will be described later, and hereinafter, will be referred to as first main pads 102-1B. The others (see the reference symbol 102-1C) among the plurality of first top surface substrate pads 102-1 may be connected in common to the sub semiconductor chip 114 and the first main semiconductor chip 124, and hereinafter, will be referred to as first common pads 102-1C.

Some (see the reference symbol 102-2A) among the plurality of second top surface substrate pads 102-2 may be connected to the sub semiconductor chip 114, and hereinafter, will be referred to as second sub pads 102-2A. Others (see the reference symbol 102-2B) among the plurality of second top surface substrate pads 102-2 may be connected to a second main semiconductor chip 134 which will be described later, and hereinafter, will be referred to as second main pads 102-2B. The others (see the reference symbol 102-2C) among the plurality of second top surface substrate pads 102-2 may be connected in common to the sub semiconductor chip 114 and the second main semiconductor chip 134, and hereinafter, will be referred to as second common pads 102-2C.

The sub semiconductor package 110 may have a planar area smaller than the top surface of the substrate 100. The sub semiconductor package 110 may be disposed to expose at least both the side edges and/or the top surface substrate pads 102 of the substrate 100 in the first direction. As an example, the sub semiconductor package 110 may be disposed on the center part of the substrate 100.

The sub semiconductor package 110 may include the sub semiconductor chip 114, a sub molding layer 116 which surrounds the side surfaces of the sub semiconductor chip 114, and a redistribution structure 118 which is formed on the top surfaces of the sub semiconductor chip 114 and the sub molding layer 116. A sub package adhesive layer 112 which attaches the sub semiconductor package 110 to the substrate 100 may be formed on the bottom surfaces of the sub semiconductor package 110.

The sub semiconductor chip 114 may be various semiconductor chips which perform functions required for the operation of first main semiconductor chips 124 and/or second main semiconductor chips 134. As an example, in the case where each of the first and second main semiconductor chips 124 and 134 includes a nonvolatile memory such as a NAND flash memory, the sub semiconductor chip 114 may include a controller for controlling the first and second main semiconductor chips 124 and 134. However, it is to be noted that the disclosure is not limited thereto, and the sub semiconductor chip 114 may include a volatile memory such as a dynamic random access memory (DRAM) and a static RAM (SRAM), a nonvolatile memory such as a NAND flash, a resistive RAM (RRAM), a phase-change RAM (PRAM), a magnetoresistive RAM (MRAM) and a ferroelectric RAM (FRAM), or other various active elements or passive elements.

The sub semiconductor chip 114 may have a bottom surface which faces the top surface of the substrate 100, a top surface which faces away from the bottom surface, and side surfaces which connect the top surface and the bottom surface. In the present embodiment, the sub semiconductor chip 114 may have four side surfaces, and these four side surfaces will be referred to as first to fourth side surfaces S1, S2, S3, and S4. The first and third side surfaces S1 and S3 may be positioned at the one side and the other side, respectively, in the first direction, and the second and fourth side surfaces S2 and S4 may be positioned at one side and the other side, respectively, in the second direction substantially perpendicular to the first direction. For reference, the one side in the second direction to be described below may correspond to a right side in FIGS. 1 and 2, and the other side in the second direction to be described below may correspond to a left side in FIGS. 1 and 2.

Such a sub semiconductor chip 114 may be positioned at the center part of the sub semiconductor package 110. This is to make the lengths of a first redistribution conductive layer 118B-1 and a second redistribution conductive layer 118B-2 which will be described later, as similar to each other as possible.

Sub chip pads 115 may be disposed on the top surface of the sub semiconductor chip 114. The sub semiconductor chip 114 may have a relatively small planar area, whereas the number of the sub chip pads 115 may be relatively large. As an example, a case where the sub semiconductor chip 114 is a memory controller and the first and second main semiconductor chips 124 and 134 are memories may be assumed. In this case, while the size of the sub semiconductor chip 114 decreases with the development of technology, in order for the respective first and second chip stacks 120 and 130 and the sub semiconductor chip 114 to be connected through independent channels, a number of sub chip pads 115 corresponding to a number of input/output signals may be required. Because of this fact, the sub chip pads 115 may be arranged along the entire edges of the sub semiconductor chip 114. That is to say, the sub chip pads 115 may be arranged along the first to fourth side surfaces S1, S2, S3, and S4 of the sub semiconductor chip 114 adjacent to the first to fourth side surfaces S1, S2, S3, and S4.

The sub molding layer 116 may have a top surface having substantially the same height as the top surface of the sub semiconductor chip 114 while surrounding the side surfaces of the sub semiconductor chip 114, thereby exposing the top surface of the sub semiconductor chip 114 and the sub chip pads 115. In the present embodiment, the sub molding layer 116 may have a bottom surface having substantially the same height as the bottom surface of the sub semiconductor chip 114. However, it is to be noted that the disclosure is not limited thereto, and the sub molding layer 116 may cover the bottom surface of the sub semiconductor chip 114. The sub molding layer 116 may include various molding materials such as an epoxy molding compound (EMC).

The sub package adhesive layer 112 for attaching the sub semiconductor package 110 to the substrate 100 may include an insulating adhesive material such as a die attach film (DAF). The sub package adhesive layer 112 may be omitted.

The redistribution structure 118 may extend onto the top surface of the sub molding layer 116 while being electrically connected with the sub chip pads 115. In other words, the sub semiconductor package 110 according to the present embodiment may be a fan-out package.

In detail, the redistribution structure 118 may include a first redistribution insulation layer 118A, redistribution conductive layers 118B, and a second redistribution insulation layer 118C. The first redistribution insulation layer 118A may be formed on the top surfaces of the sub semiconductor chip 114 and the sub molding layer 116. The first redistribution insulation layer 118A may have openings exposing the sub chip pads 115. The redistribution conductive layers 118B may be formed on the first redistribution insulation layer 118A. The redistribution conductive layers 118B may be electrically connected with the sub chip pads 115 through the openings of the first redistribution insulation layer 118A. The second redistribution insulation layer 118C may cover the first redistribution insulation layer 118A and the redistribution conductive layers 118B. The second redistribution insulation layer 118C may have openings exposing ends of the redistribution conductive layers 118B. The first redistribution insulation layer 118A and the second redistribution insulation layer 118C may include an insulation material such as oxide, nitride or oxynitride. Alternatively, the first redistribution insulation layer 118A and the second redistribution insulation layer 118C may include a resin material such as epoxy, polyimide, polybenzoxazole (PBO), benzocyclobuten (BCB), silicone or acrylate. The redistribution conductive layers 118B may include a metal material such as gold, copper or a copper alloy.

Specifically, portions of the redistribution conductive layers 118B which are exposed by the openings of the second redistribution insulation layer 118C will be hereinafter referred to as redistribution pads 118BP. In the top views of FIGS. 1 and 2, for the sake of convenience in explanation, the first and second redistribution insulation layers 118A and 118C of the redistribution structure 118 are not illustrated. The redistribution pads 118BP may be disposed at both side edges of the sub molding layer 116 in the first direction, similarly to the disposition of the top surface substrate pads 102. The redistribution pads 118BP which are disposed at one side edge of the sub molding layer 116 in the first direction may be referred to as first redistribution pads 118BP-1, and the redistribution pads 118BP which are disposed at the other side edge of the sub molding layer 116 in the first direction may be referred to as second redistribution pads 118BP-2. The first redistribution pads 118BP-1 may be relatively adjacent to the first top surface substrate pads 102-1, and the second redistribution pads 1183P-2 may be relatively adjacent to the second top surface substrate pads 102-2. In the present embodiment, the first redistribution pads 118BP-1 may be arranged in a line in the second direction. Also, the second redistribution pads 118BP-2 may be arranged in a line in the second direction. However, it is to be noted that the disclosure is not limited thereto, and the numbers, arrangements and so forth of the first and second redistribution pads 118BP-1 and 118BP-2 at both the side edges of the sub molding layer 116 may be variously changed.

According to the above-described arrangement of the redistribution pads 118BP, the redistribution conductive layers 118B may extend from the sub chip pads 115 which are arranged along the first side surface S1 and the second side surface S2 of the sub semiconductor chip 114, to the first redistribution pads 118BP-1, and may extend from the sub chip pads 115 which are arranged along the third side surface S3 and the fourth side surface S4 of the sub semiconductor chip 114, to the second redistribution pads 118BP-2. The redistribution conductive layers 118B which extend to the first redistribution pads 118BP-1 may be referred to as first redistribution conductive layers 118B-1, and the redistribution conductive layers 118B which extend to the second redistribution pads 118BP-2 may be referred to as second redistribution conductive layers 118B-2. The first redistribution conductive layers 118B-1 which extend from the second side surface S2 of the sub semiconductor chip 114 may have shapes which are curved toward the first redistribution pads 118BP-1, for connection with the first redistribution pads 118BP-1. Because the first redistribution conductive layers 118B-1 which extend from the first side surface S1 of the sub semiconductor chip 114 face the first redistribution pads 118BP-1, they do not need to be curved for connection with the first redistribution pads 118BP-1. However, in order to have lengths similar to the first redistribution conductive layers 118B-1 which extend from the second side surface S2 of the sub semiconductor chip 114, the first redistribution conductive layers 118B-1 which extend from the first side surface S1 of the sub semiconductor chip 114 may also have curved shapes. Further, the second redistribution conductive layers 118B-2 which extend from the fourth side surface S4 of the sub semiconductor chip 114 may have shapes which are curved toward the second redistribution pads 118BP-2. In order to have lengths similar to the second redistribution conductive layers 118B-2 which extend from the fourth side surface S4 of the sub semiconductor chip 114, the second redistribution conductive layers 118B-2 which extend from the third side surface S3 of the sub semiconductor chip 114 may also have curved shapes. As a result, the redistribution conductive layers 118E may have a shape similar to a tornado, for example, a spiral shape, centering on the sub semiconductor chip 114. Through such a connection scheme, the lengths of the redistribution conductive layers 118B may be similar to one another.

Sub package interconnectors 117 may include first sub package interconnectors 117-1 which connect the first redistribution pads 118BP-1 and the first top surface substrate pads 102-1, and second sub package interconnectors 117-2 which connect the second redistribution pads 118BP-2 and the second top surface substrate pads 102-2. By this fact, the sub semiconductor chip 114 and the substrate 100 may be electrically connected. The sub package interconnectors 117 may be bonding wires having one ends which are connected with the top surface substrate pads 102 and the other ends which are connected with the redistribution pads 118BP. However, it is to be noted that embodiments are not limited thereto, and various types of electrical interconnectors may be used as the sub package interconnectors 117.

The first chip stack 120 may include the plurality of first main semiconductor chips 124 which are formed on the sub semiconductor package 110 and are stacked in a vertical direction with respect to the top surface of the substrate 100. While the present embodiment illustrates a case where the first chip stack 120 includes four first main semiconductor chips 124, it is to be noted that the disclosure is not limited thereto, and the number of first main semiconductor chips 124 included in the first chip stack 120 may be changed variously among one or more first main semiconductor chips.

Each of the first main semiconductor chips 124 may include a NAND flash memory as described above. However, it is to be noted that the disclosure is not limited thereto, and each of the first main semiconductor chips 124 may include a volatile memory such as a dynamic random access memory (DRAM) and a static RAM (SRAM) or a nonvolatile memory such as a resistive RAM (RRAM), a phase-change RAM (PRAM), a magnetoresistive RAM (MRAM) and a ferroelectric RAM (FRAM).

The first main semiconductor chips 124 may be stacked with a predetermined offset in a direction facing the other side in the first direction, for example, in a direction facing the lower side in FIG. 1 and the right side in FIG. 3. By this fact, the first chip stack 120 which has a step shape when viewed in its entirety may be formed. The offset stacking direction of the first main semiconductor chips 124 may be referred to as a first offset direction. According to such offset stacking, one side edge, for example, the upper side edge in FIG. 1 and the left side edge in FIG. 3 of the top surface of each of the remaining first main semiconductor chips 124 except the uppermost first main semiconductor chip 124 among the first main semiconductor chips 124 may be exposed without being covered by the first main semiconductor chip 124 lying immediately thereon. One side edge of the top surface of the uppermost first main semiconductor chip 124 may be exposed without being covered by the lowermost second main semiconductor chip 134 of the second chip stack 130 which will be described later. First chip pads 125 may be disposed on such exposed portions of the first main semiconductor chips 124. A plurality of first chip pads 125 may be arranged in a line in the second direction at the one side edge of the top surface of each of the first main semiconductor chips 124. However, it is to be noted that the disclosure is not limited thereto, and the number and arrangement of the first chip pads 125 at the one side edge of the top surface of each of the first main semiconductor chips 124 may be variously changed. For reference, because a part of the first chip stack 120 which is hidden by the second chip stack 130 is not illustrated in the top view of FIG. 1, a portion of the first chip stack 120, for example, a one side edge portion of the lowermost first main semiconductor chip 124, is illustrated.

Each of the first main semiconductor chips 124 may be attached to the sub semiconductor package 110 or the first main semiconductor chip 124 lying immediately thereunder, by a first adhesive layer 122. The first adhesive layer 122 may be formed on the bottom surface of each of the first main semiconductor chips 124 to have a shape overlapping with the bottom surface.

The first chip stack 120 or the first main semiconductor chips 124 may have a planar area smaller than the sub semiconductor package 110, and may have a planar area larger than the sub semiconductor chip 114. The first chip stack 120 may be disposed to expose at least the redistribution pads 118BP disposed at both side edges of the sub semiconductor package 110 in the first direction.

First interconnectors 127 may connect the first chip pads 125 adjacent in the vertical direction with each other, and may electrically connect the first chip pads 125 of the lowermost first main semiconductor chip 124 with the first top surface substrate pads 102-1, By this fact, the first main semiconductor chips 124 may be electrically connected with one another, and the first chip stack 120 may be electrically connected with the substrate 100. The first interconnectors 127 may be bonding wires. However, it is to be noted that embodiments are not limited thereto, and various types of electrical interconnectors may be used as the first interconnectors 127. The first interconnectors 127 may be connected to the first common pads 102-1C together with the first sub package interconnectors 117-1, or may be independently connected to the first main pads 102-1B to which the first sub package interconnectors 117-1 are not connected.

The second chip stack 130 may include the plurality of second main semiconductor chips 134 which are formed on the first chip stack 120 and are stacked in the vertical direction. While the present embodiment illustrates a case where the second chip stack 130 includes four second main semiconductor chips 134, it is to be noted that the disclosure is not limited thereto, and the number of second main semiconductor chips 134 included in the second chip stack 130 may be changed variously to at least one. Also, while, in the present embodiment, the number of second main semiconductor chips 134 included in the second chip stack 130 is the same as the number of first main semiconductor chips 124 included in the first chip stack 120, it is to be noted that these numbers may be different from each other.

Each of the second main semiconductor chips 134 may include a NAND flash memory as described above. However, it is to be noted that the disclosure is not limited thereto, and each of the second main semiconductor chips 134 may include a volatile memory, such as a dynamic random access memory (DRAM) and a static RAM (SRAM), or a nonvolatile memory, such as a resistive RAM (RRAM), a phase-change RAM (PRAM), a magnetoresistive RAM (MRAM) and a ferroelectric RAM (FRAM). In the present embodiment, the second main semiconductor chips 134 are the same semiconductor chips as the first main semiconductor chips 124, but it is to be noted that the second main semiconductor chips 134 may be semiconductor chips different from the first main semiconductor chips 124.

The second main semiconductor chips 134 may be stacked with a predetermined offset in a direction facing the one side in the first direction, for example, in a direction facing the upper side in FIG. 1 and the left side in FIG. 3. By this fact, the second chip stack 130 which has a step shape when viewed in its entirety may be formed. The offset stacking direction of the second main semiconductor chips 134 may be referred to as a second offset direction. The second offset direction may be opposite to the first offset direction. According to such offset stacking, the other side edge, for example, the lower side edge in FIG. 1 and the right side edge in FIG. 3 of the top surface of each of the remaining second main semiconductor chips 134 except the uppermost second main semiconductor chip 134 among the second main semiconductor chips 134 may be exposed without being covered by the second main semiconductor chip 134 lying immediately thereon. The uppermost second main semiconductor chip 134 may be in a state in which its entire top surface is exposed. Second chip pads 135 may be disposed on the exposed portions of the remaining second main semiconductor chips 134 except the uppermost second main semiconductor chip 134, and second chip pads 135 of the uppermost second main semiconductor chip 134 may also be disposed at the same positions as the second chip pads 135 of the remaining second main semiconductor chips 134. A plurality of second chip pads 135 may be arranged in a line in the second direction at the other side edge of the top surface of each of the second main semiconductor chips 134. However, it is to be noted that the disclosure is not limited thereto, and the number and arrangement of the second chip pads 135 at the other side edge of the top surface of each of the second main semiconductor chips 134 may be variously changed.

In the case where the second main semiconductor chips 134 are the same semiconductor chips as the first main semiconductor chips 124, the second main semiconductor chips 134 may correspond to a state in which the first main semiconductor chips 124 are rotated by 180 degrees about one axis extending in the vertical direction.

Each of the second main semiconductor chips 134 may be attached to the second main semiconductor chip 134 or the uppermost first main semiconductor chip 124 of the first chip stack 120 lying immediately thereunder, by a second adhesive layer 132. The second adhesive layer 132 may be formed on the bottom surface of each of the second main semiconductor chips 134 to have a shape overlapping with the bottom surface.

The second chip stack 130 or the second main semiconductor chips 134 may have a planar area smaller than the sub semiconductor package 110, and may have a planar area larger than the sub semiconductor chip 114. The second chip stack 130 may be disposed to expose at least both the side edges of the sub semiconductor package 110, that is, the redistribution pads 118BP, in the first direction.

Second interconnectors 137 may connect the second chip pads 135 adjacent in the vertical direction with each other, and may electrically connect the second chip pads 135 of the lowermost second main semiconductor chip 134 with the second top surface substrate pads 102-2. By this fact, the second main semiconductor chips 134 may be electrically connected with one another, and the second chip stack 130 may be electrically connected with the substrate 100. The second interconnectors 137 may be bonding wires. However, it is to be noted that embodiments are not limited thereto, and various types of electrical interconnectors may be used as the second interconnectors 137. The second interconnectors 137 may be connected to the second common pads 102-2C together with the second sub package interconnectors 117-2, or may be independently connected to the second main pads 102-2B to which the second sub package interconnectors 117-2 are not connected.

In the top views of FIGS. 1 and 2, the sub package interconnectors 117, the first interconnectors 127 and the second interconnectors 137 are illustrated by solid lines and dotted lines for the sake of convenience in distinction. However, it is to be noted that, as a matter of course, such solid lines and dotted lines do not reflect the actual shapes of the interconnectors 117, 127, and 137.

The sub semiconductor package 110, the first chip stack 120 and the second chip stack 130 may be covered by a molding layer 150 which is formed on the substrate 100. The molding layer 150 may include various molding materials such as an EMC.

The external connection terminals 140 described above may include solder balls. However, it is to be noted that the disclosure is not limited thereto, and various conductive terminals such as bumps may be used as the external connection terminals 140.

In the semiconductor package described above, the first chip stack 120 may be recognized as a single semiconductor chip while being connected with the first top surface substrate pads 102-1 of the substrate 100 through the first interconnectors 127. An electrical path from the first chip stack 120 to the substrate 100 may be referred to as a first channel. The second chip stack 130 may be recognized as another single semiconductor chip different from the first chip stack 120 while being connected with the second top surface substrate pads 102-2 of the substrate 100 through the second interconnectors 137. An electrical path from the second chip stack 130 to the substrate 100 may be referred to as a second channel. The first channel and the second channel may be electrically and physically isolated from each other. The sub semiconductor chip 114 may be connected with the first top surface substrate pads 102-1 and the second top surface substrate pads 102-2 of the substrate 100 through the redistribution structure 118 and the sub package interconnectors 117.

The first sub pads 102-1A which are independently connected to the sub semiconductor chip 114 may be power supply pads for the sub semiconductor chip 114, for example, controller power supply pads, or signal transfer pads of the sub semiconductor chip 114, for example, input/output signal transfer pads. The first main pads 102-1B to which the first chip stack 120 is independently connected may be power supply pads for the first chip stack 120, for example, memory power supply pads, or signal transfer pads of the first chip stack 120, for example, input/output signal transfer pads. In the case where the first sub pads 102-1A are signal transfer pads of the sub semiconductor chip 114 and the first main pads 102-1B are signal transfer pads of the first chip stack 120, these signal transfer pads may be connected with each other through a circuit or wiring structure (not illustrated) in the substrate 100 to enable signal transfer between the sub semiconductor chip 114 and the first chip stack 120. The first common pads 102-1C to which the sub semiconductor chip 114 and the first chip stack 120 are connected in common may be ground supply pads.

Similarly, the second sub pads 102-2A which are independently connected to the sub semiconductor chip 114 may be power supply pads for the sub semiconductor chip 114, for example, controller power supply pads, or signal transfer pads of the sub semiconductor chip 114. The second main pads 102-2B to which the second chip stack 130 is independently connected may be power supply pads for the second chip stack 130, for example, memory power supply pads, or signal transfer pads of the second chip stack 130. In the case where the second sub pads 102-2A are signal transfer pads of the sub semiconductor chip 114 and the second main pads 102-2B are signal transfer pads of the second chip stack 130, these signal transfer pads may be connected with each other through a circuit or wiring structure (not illustrated) in the substrate 100 to enable signal transfer between the sub semiconductor chip 114 and the second chip stack 130. The second common pads 102-2C to which the sub semiconductor chip 114 and the second chip stack 130 are connected in common may be ground supply pads.

According to the semiconductor package described above, the following effects may be achieved.

First, as the sub chip pads 115 are disposed along the entire edges of the sub semiconductor chip 114, a relatively large number of sub chip pads 115 may be disposed as compared to the size of the sub semiconductor chip 114. In addition, by redistributing the sub chip pads 115 through using a fan-out technology, the connection between the sub chip pads 115 and the chip pads 125 and 135 of the main semiconductor chips 124 and 134 may be easily implemented. For example, if bonding wires are directly connected to the sub semiconductor chip 114, the disposition of the sub chip pads 115 may be restricted due to physical limitations such as the size and movement radius of wire capillaries. On the other hand, as in the present embodiment, if the sub chip pads 115 are redistributed using the redistribution pads 118BP through the fan-out technology, design might not be affected by such limitations.

Moreover, because the sub semiconductor package 110 larger than the first main semiconductor chips 124 is disposed under the first chip stack 120 by using the fan-out technology, the first chip stack 120 may be stably formed. In a structure in which the first chip stack 120 is formed on the sub semiconductor chip 114, if the sub semiconductor chip 114 is smaller than the first main semiconductor chips 124, a problem may be caused in that the first chip stack 120 is inclined. By substantially increasing the area of the sub semiconductor chip 114 using the fan-out technology, such a problem might not be caused.

Furthermore, by adjusting the shapes and/or arrangements of the respective redistribution conductive layers 118B connecting the sub chip pads 115 and the redistribution pads 118BP to cause the respective redistribution conductive layers 118B to have similar lengths, the operation characteristics of the semiconductor package may be secured. For example, in the case where the first channel which is connected from the first chip stack 120 to the substrate 100 is connected with the sub semiconductor chip 114 via the substrate 100, the first sub package interconnectors 117-1 and the first redistribution conductive layers 118B-1/the first redistribution pads 118BP-1 in order to exchange signals with the sub semiconductor chip 114 and the second channel which is connected from the second chip stack 130 to the substrate 100 is connected with the sub semiconductor chip 114 via the substrate 100, the second sub package interconnectors 117-2 and the second redistribution conductive layers 118B-2/the second redistribution pads 118BP-2 in order to exchange signals with the sub semiconductor chip 114, by adjusting the lengths of the first redistribution conductive layers 118B-1 and the second redistribution conductive layers 118B-2 to similar levels, it is possible to maximally prevent the transfer rates of signals, for example, data, from becoming different from channel to channel.

In the above-described embodiment, the first chip stack 120 and the sub semiconductor chip 114 are connected with each other through the substrate 100, and the second chip stack 130 and the sub semiconductor chip 114 are also connected with each other through the substrate 100. However, in another embodiment, the first chip stack 120 and the sub semiconductor chip 114 may be connected with each other by using interconnectors without using the substrate 100, and the second chip stack 130 and the sub semiconductor chip 114 may be connected with each other by using interconnectors without using the substrate 100. This will be described below with reference to FIGS. 4 to 9.

Figure 4:
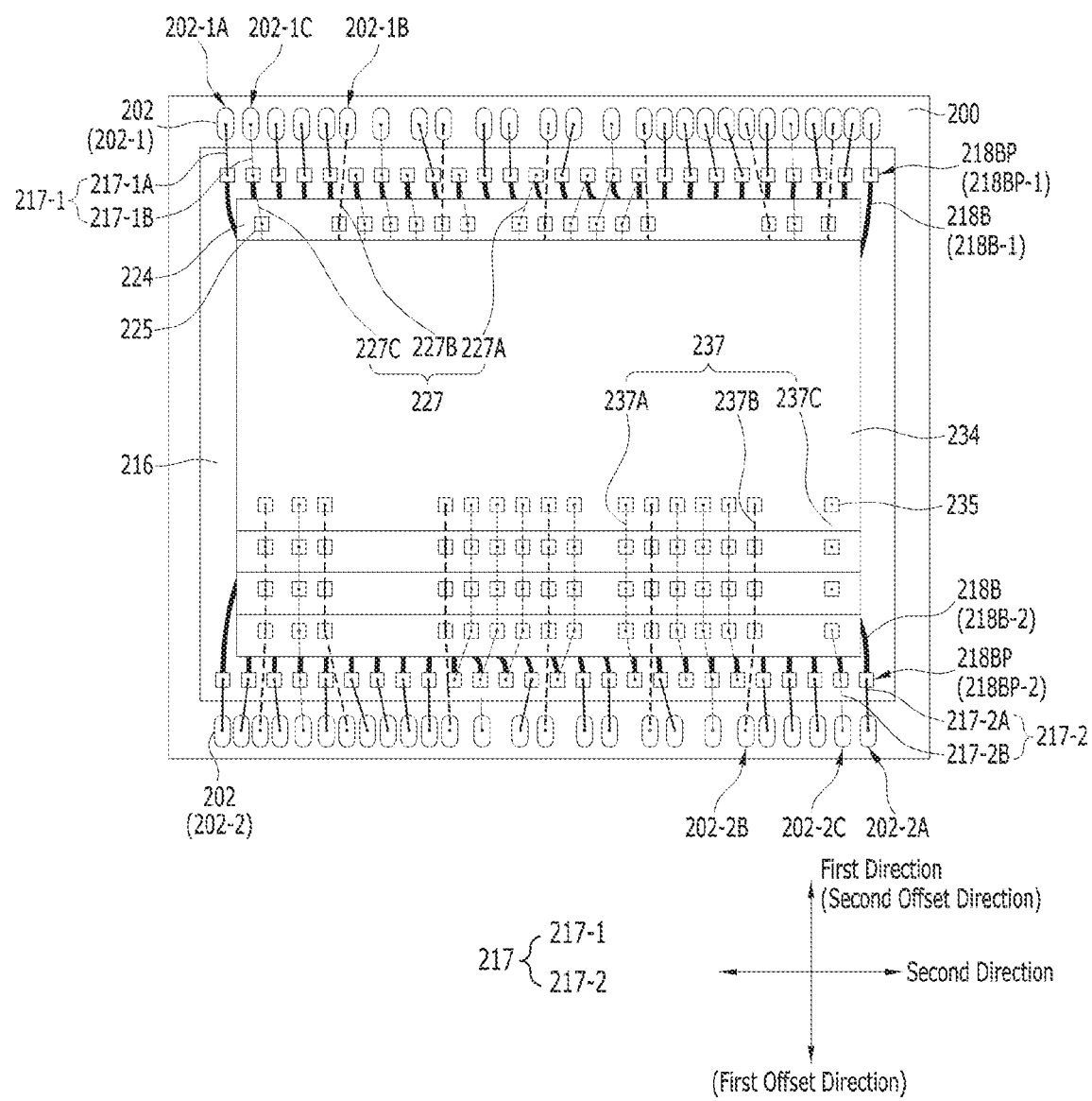
FIG. 4 is a planar view illustrating a semiconductor package in accordance with another embodiment of the present disclosure.
Figure 5:
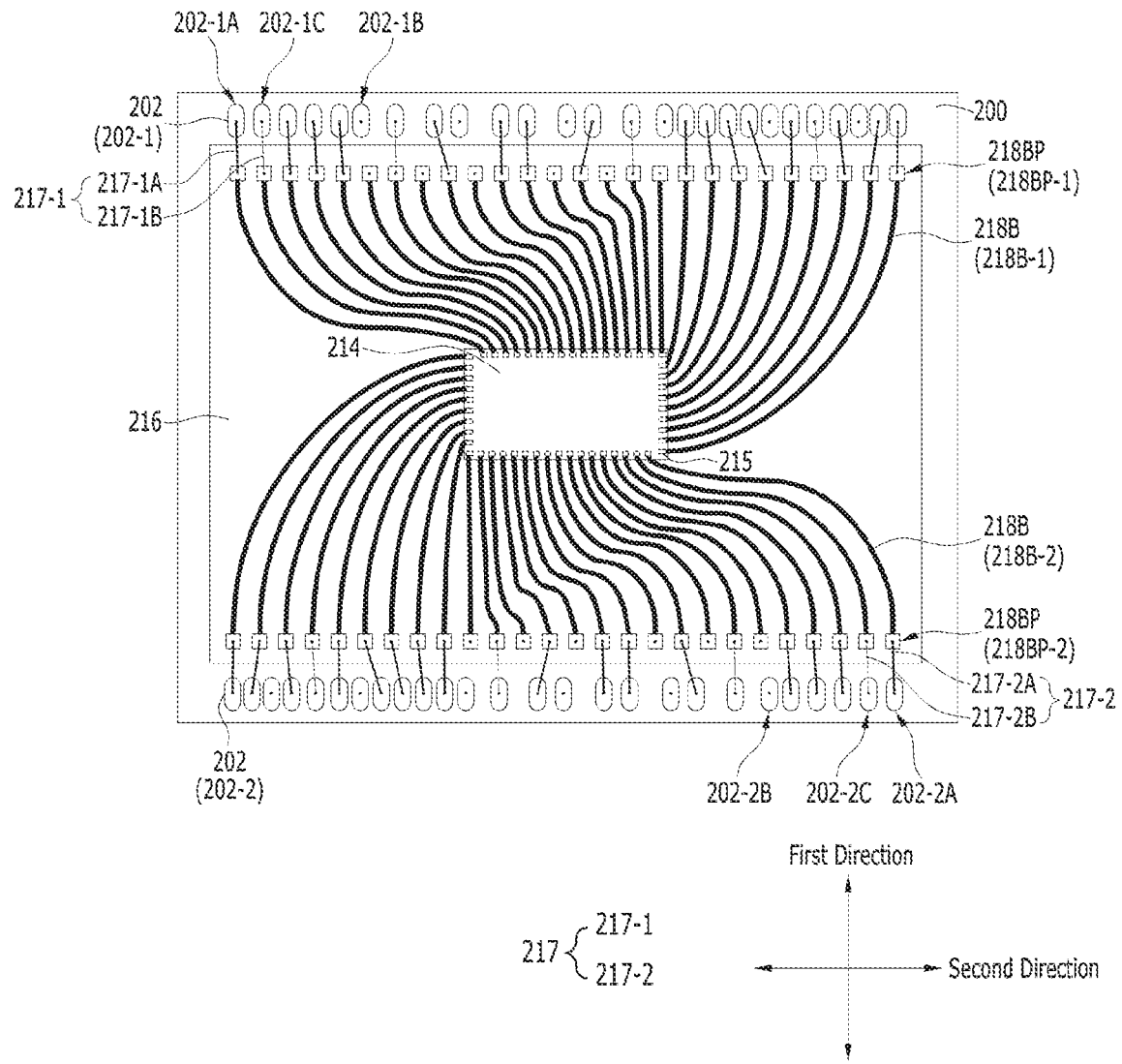
FIG. 5 is a planar view illustrating a part of the semiconductor package illustrated in FIG. 4, with a first chip stack, a second chip stack, and interconnectors connected with the first and second chip stacks omitted.
Figure 6:
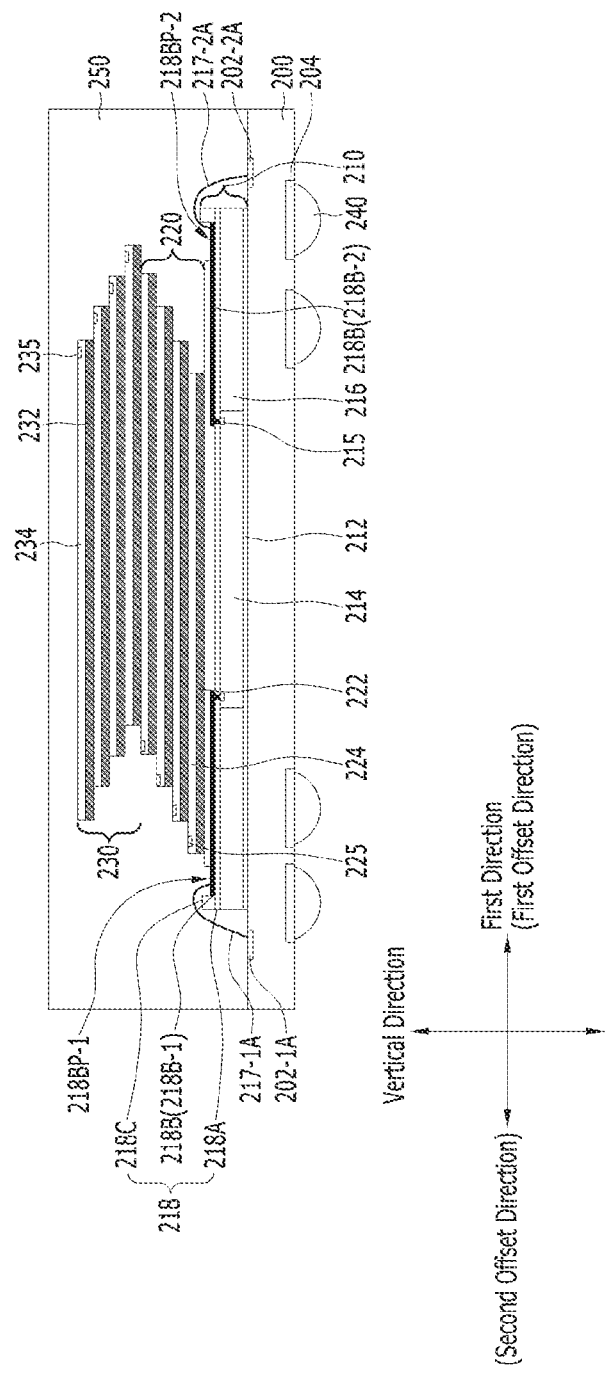
FIGS. 6 to 9 are cross-sectional views illustrating the semiconductor package illustrated in FIG. 4.
Figure 7:
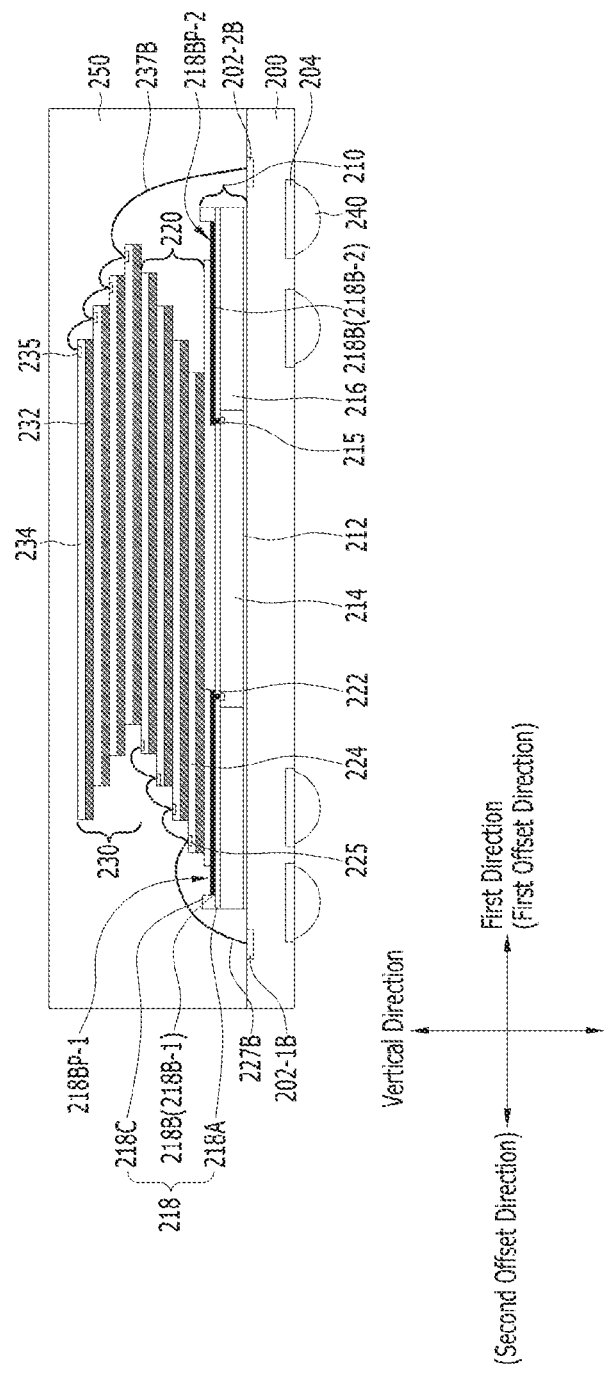
Figure 8:
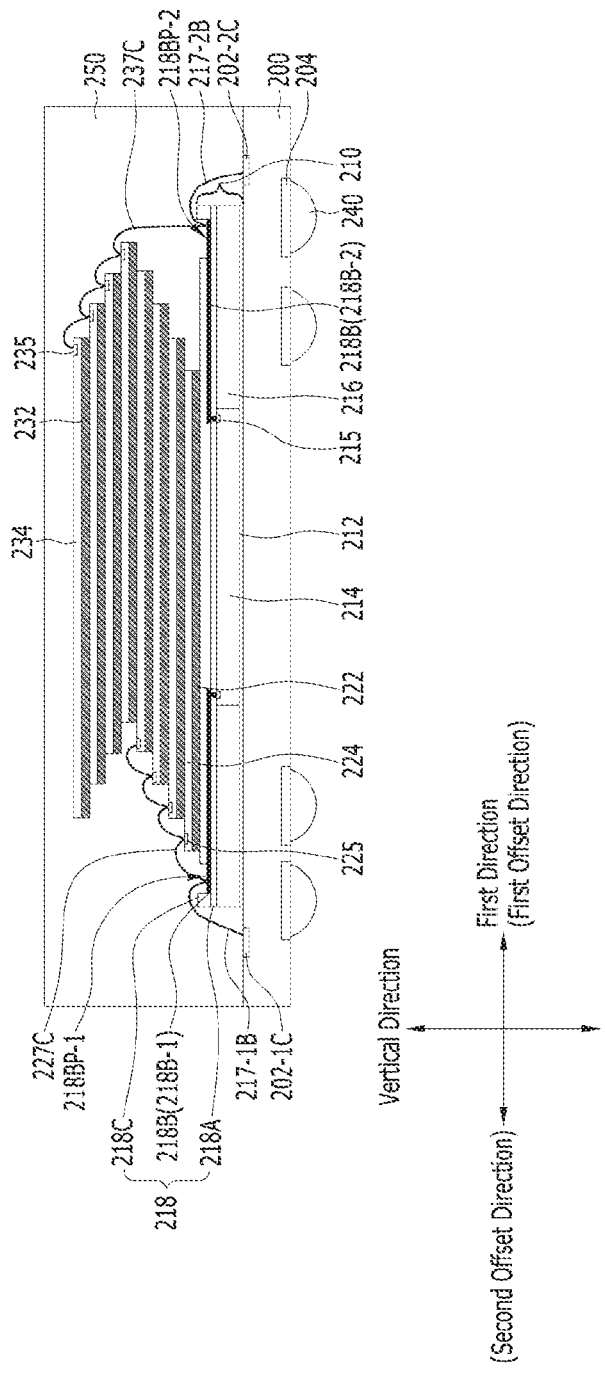
Figure 9:
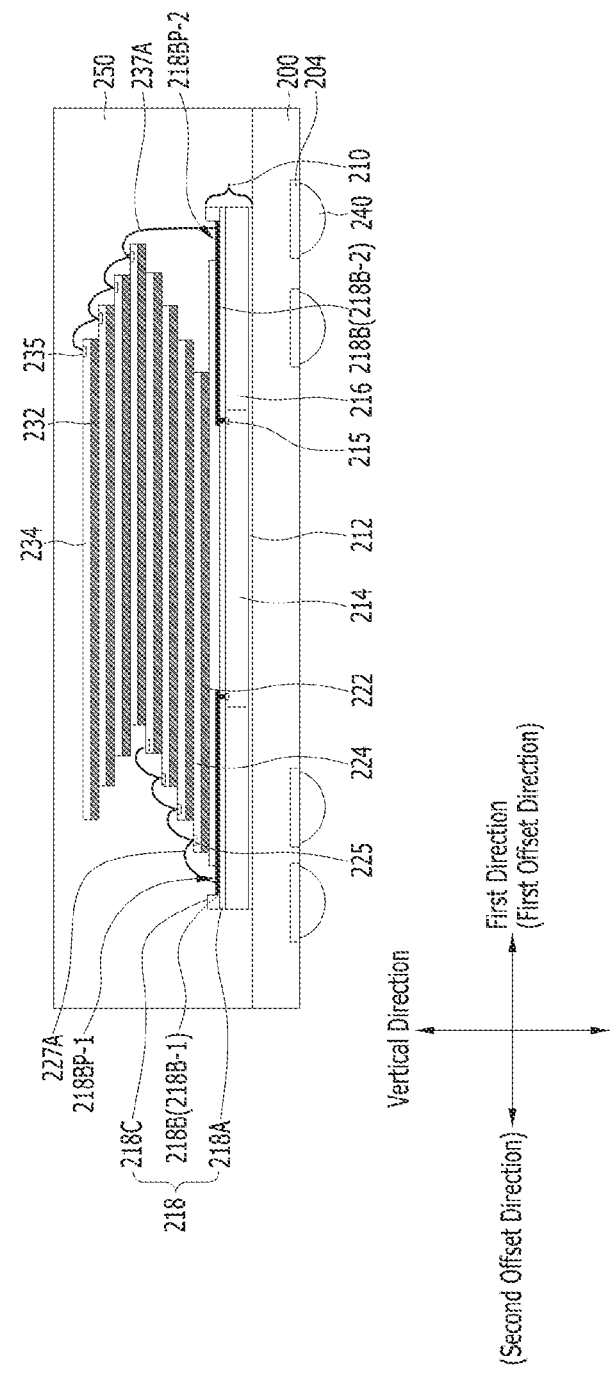

FIG. 4 is a planar view illustrating a semiconductor package in accordance with another embodiment of the present disclosure, FIG. 5 is a planar view illustrating a part of the semiconductor package illustrated in FIG. 4, with a first chip stack, a second chip stack and interconnectors connected with the first and second chip stacks omitted, and FIGS. 6 to 9 are cross-sectional views illustrating the semiconductor package illustrated in FIG. 4. FIGS. 4 and 5 are top views of the semiconductor package and the part thereof, respectively, in accordance with the present embodiment. FIG. 6 illustrates a cross-section taken along a line passing through the reference symbols 202-1A, 218B-1, 218B-2, and 202-2A of FIG. 4, FIG. 7 illustrates a cross-section taken along a line passing through the reference symbols 202-1B, 218B-1, 218B-2, and 202-2B of FIG. 4, FIG. 8 illustrates a cross-section taken along a line passing through the reference symbols 202-1C, 218B-1, 218B-2, and 202-2C of FIG. 4, and FIG. 9 illustrates a cross-section taken along a line passing through the reference symbols 227A, 218B-1, 218B-2, and 237A of FIG. 4. Hereinafter, descriptions will be made mainly for differences from the above-described embodiment.

Referring to FIGS. 4 to 9, the semiconductor package in accordance with another embodiment of the disclosure may include a substrate 200, a sub semiconductor package 210 which is disposed on the substrate 200, and first and second chip stacks 220 and 230 which are disposed on the sub semiconductor package 210.

The substrate 200 may include top surface substrate pads 202 disposed on the top surface thereof and bottom surface substrate pads 204 disposed on the bottom surface thereof. Among the top surface substrate pads 202, those disposed on one side in a first direction may be referred to as first top surface substrate pads 202-1, and those disposed on the other side in the first direction may be referred to as second top surface substrate pads 202-2.

Some (see the reference symbol 202-1A) among the plurality of first top surface substrate pads 202-1 may be connected to only a sub semiconductor chip 214 which will be described later, and hereinafter, will be referred to as first sub pads 202-1A. Others (see the reference symbol 202-1B) among the plurality of first top surface substrate pads 202-1 may be connected to only a first main semiconductor chip 224 which will be described later, and hereinafter, will be referred to as first main pads 202-1B. The others (see the reference symbol 202-1C) among the plurality of first top surface substrate pads 202-1 may be connected in common to the sub semiconductor chip 214 and the first main semiconductor chip 224, and hereinafter, will be referred to as first common pads 202-1C. Unlike that, in the above-described embodiment, interconnectors which are connected with a sub semiconductor chip and interconnectors which are connected with a first main semiconductor chip are connected together to first common pads, in the present embodiment, interconnectors (see the reference symbol 227C) which are connected to the first main semiconductor chip 224 are not directly connected to the first common pads 202-1C. The interconnectors 227C which are connected to the first main semiconductor chip 224 may be electrically connected to the first common pads 202-1C through interconnectors 217-1B which are connected to the sub semiconductor chip 214. Namely, only the interconnectors 217-1B which are connected to the sub semiconductor chip 214 may be directly connected to the first common pads 202-1C.

Also, some (see the reference symbol 202-2A) among the plurality of second top surface substrate pads 202-2 may be connected to only the sub semiconductor chip 214, and hereinafter, will be referred to as second sub pads 202-2A. Others (see the reference symbol 202-2B) among the plurality of second top surface substrate pads 202-2 may be connected to only a second main semiconductor chip 234 which will be described later, and hereinafter, will be referred to as second main pads 202-2B. The others (see the reference symbol 202-2C) among the plurality of second top surface substrate pads 202-2 may be connected in common to the sub semiconductor chip 214 and the second main semiconductor chip 234, and hereinafter, will be referred to as second common pads 202-2C. Similarly to the first common pads 202-1C, only interconnectors (see the reference symbol 217-2B) which are connected to the sub semiconductor chip 214 may be directly connected to the second common pads 202-2C. Interconnectors 237C which are connected with the second main semiconductor chip 234 might not be directly connected to the second common pads 202-2C.

The sub semiconductor package 210 may include the sub semiconductor chip 214 which includes sub chip pads 215 formed on the top surface thereof, a sub molding layer 216 which surrounds the side surfaces of the sub semiconductor chip 214, and a redistribution structure 218 which is formed on the top surfaces of the sub semiconductor chip 214 and the sub molding layer 216. A sub package adhesive layer 212 which attaches the sub semiconductor package 210 to the substrate 200 may be formed on the bottom surfaces of the sub semiconductor chip 214 and the sub molding layer 216.

The redistribution structure 218 may include a first redistribution insulation layer 218A which is formed on the top surfaces of the sub semiconductor chip 214 and the sub molding layer 216 and has openings exposing the sub chip pads 215, redistribution conductive layers 218B which are formed on the first redistribution insulation layer 218A and are electrically connected with the sub chip pads 215 through the openings of the first redistribution insulation layer 218A, and a second redistribution insulation layer 218C which covers the first redistribution insulation layer 218A and the redistribution conductive layers 218B and has openings exposing ends of the redistribution conductive layers 218B. Portions of the redistribution conductive layers 218B which are exposed by the openings of the second redistribution insulation layer 218C will be hereinafter referred to as redistribution pads 218BP. The redistribution pads 218BP may include first redistribution pads 218BP-1 which are disposed at one side edge of the sub molding layer 216 in the first direction, and second redistribution pads 218BP-2 which are disposed at the other side edge of the sub molding layer 216 in the first direction. The redistribution conductive layers 218B may include first redistribution conductive layers 218B-1 which are connected with the first redistribution pads 218BP-1, and second redistribution conductive layers 218B-2 which are connected with the second redistribution pads 218BP-2.

Sub package interconnectors 217 may include first sub package interconnectors 217-1 which connect the first redistribution pads 218BP-1 and the first top surface substrate pads 202-1, and second sub package interconnectors 217-2 which connect the second redistribution pads 218BP-2 and the second top surface substrate pads 202-2. By this fact, the sub semiconductor chip 214 and the substrate 200 may be electrically connected. Furthermore, the first sub package interconnectors 217-1 may include first independent sub package interconnectors 217-1A which connect only the sub semiconductor chip 214 with the first sub pads 202-1A, and first common sub package interconnectors 217-1B which are also electrically connected with the first chip stack 220. One ends of the first independent sub package interconnectors 217-1A may be connected to the first sub pads 202-1A, and one ends of the first common sub package interconnectors 217-1B may be connected to the first common pads 202-1C.

The second sub package interconnectors 217-2 may include second independent sub package interconnectors 217-2A which connect only the sub semiconductor chip 214 with the second sub pads 202-2A, and second common sub package interconnectors 217-2B which are also electrically connected with the second chip stack 230. One ends of the second independent sub package interconnectors 217-2A may be connected to the second sub pads 202-2A, and one ends of the second common sub package interconnectors 217-2B may be connected to the second common pads 202-2C.

The first chip stack 220 may have a structure in which one or more first main semiconductor chips 224 are offset-stacked in a first offset direction. Each of the first main semiconductor chips 224 may include first chip pads 225 formed at one side edge of the top surface thereof. Each of the first main semiconductor chips 224 may be attached to the sub semiconductor package 210 or the first main semiconductor chip 224 lying immediately thereunder, by a first adhesive layer 222 formed on the bottom surface thereof.

First interconnectors 227 may connect the first chip pads 225 adjacent in a vertical direction with each other, and may electrically connect the first chip pads 225 of the lowermost first main semiconductor chip 224 with the first top surface substrate pads 202-1 or the first redistribution pads 218BP-1. By this fact, the first main semiconductor chips 224 may be electrically connected with one another, and the first chip stack 220 may be electrically connected with the substrate 200 or the sub semiconductor chip 214. The first interconnectors 227 may include first common interconnectors 227C which are connected to the first redistribution pads 218BP-1 to which the first common sub package interconnectors 217-1B are connected, first independent interconnectors 227B which are connected with the first main pads 202-1B among the first top surface substrate pads 202-1, and first signal interconnectors 227A which are connected with those of the first redistribution pads 218BP-1 which are not connected with the first sub package interconnectors 217-1. The first signal interconnectors 227A may connect the first chip stack 220 and the sub semiconductor chip 214 with each other to enable signal transfer therebetween.

The second chip stack 230 may have a structure in which one or more second main semiconductor chips 234 are offset-stacked in a second offset direction. Each of the second main semiconductor chips 234 may include second chip pads 235 formed at one side edge of the top surface thereof. Each of the second main semiconductor chips 234 may be attached to the first chip stack 220 or the second main semiconductor chip 234 lying immediately thereunder, by a second adhesive layer 232 formed on the bottom surface thereof.

Second interconnectors 237 may connect the second chip pads 235 adjacent in the vertical direction with each other, and may electrically connect the second chip pads 235 of the lowermost second main semiconductor chip 234 with the second top surface substrate pads 202-2 or the second redistribution pads 218BP-2. By this fact, the second main semiconductor chips 234 may be electrically connected with one another, and the second chip stack 230 may be electrically connected with the substrate 200 or the sub semiconductor chip 214. The second interconnectors 237 may include second common interconnectors 237C which are connected to the second redistribution pads 218BP-2 to which the second common sub package interconnectors 217-2B are connected, second independent interconnectors 237B which are connected with the second main pads 202-2B among the second top surface substrate pads 202-2, and second signal interconnectors 237A which are connected with those of the second redistribution pads 218BP-2 which are not connected with the second sub package interconnectors 217-2. The second signal interconnectors 237A may connect the second chip stack 230 and the sub semiconductor chip 214 with each other to enable signal transfer therebetween.

The sub semiconductor package 210, the first chip stack 220 and the second chip stack 230 may be covered by a molding layer 250 which is formed on the substrate 200.

External connection terminals 240 may be connected to the bottom surface substrate pads 204 of the substrate 200.

Signal transfer paths and power supply paths in the semiconductor package configured as mentioned above will be described below.

First, referring again to FIGS. 4 to 6, only the sub semiconductor chip 214 may be connected to the first sub pads 202-1A. In detail, the first sub pads 202-1A and the sub semiconductor chip 214 may be electrically connected by a path that passes through the sub chip pads 215, the first redistribution conductive layers 218B-1 and the first independent sub package interconnectors 217-1A. The first sub pads 202-1A may be first power supply pads or first signal transfer pads for the sub semiconductor chip 214. Herein, first signal transfer might not mean signal exchange with the first chip stack 220. This is because signal exchange between the sub semiconductor chip 214 and the first chip stack 220 is implemented through the first signal interconnectors 227A.

Similarly, the second sub pads 202-2A and the sub semiconductor chip 214 may be electrically connected by a path that passes through the sub chip pads 215, the second redistribution conductive layers 218B-2 and the second independent sub package interconnectors 217-2A.

Next, referring again to FIGS. 4, 5 and 7, only the first chip stack 220 may be connected to the first main pads 202-1B through the first independent interconnectors 227B. The first main pads 202-1B may be second power supply pads or second signal transfer pads for the first chip stack 220. Herein, second signal transfer might not mean signal exchange with the sub semiconductor chip 214. This is because signal exchange between the sub semiconductor chip 214 and the first chip stack 220 is implemented through the first signal interconnectors 227A.

In the case where the sub semiconductor chip 214 is a memory controller and the first main semiconductor chips 224 are memories, the first main semiconductor chips 224 may exchange signals/data with the outside through only the sub semiconductor chip 214. In this case, the first main pads 202-1B may function as only second power supply pads in the substrate 200.

Similarly, only the second chip stack 230 may be connected to the second main pads 202-2B through the second independent interconnectors 237B. The second main pads 202-2B may be third power supply pads or third signal transfer pads for the second chip stack 230 in the substrate 200.

In the case where the sub semiconductor chip 214 is a memory controller and the second main semiconductor chips 234 are memories, the second main semiconductor chips 234 may exchange signals/data with the outside through only the sub semiconductor chip 214. In this case, the second main pads 202-2B may function as only second power supply pads in the substrate 200.

Next, referring again to FIGS. 4, 5, and 8, the sub semiconductor chip 214 and the first chip stack 220 may be connected to the first common pads 202-1C. In detail, the sub semiconductor chip 214 may be electrically connected to the first common pads 202-1C by a path that passes through the sub chip pads 215, the first redistribution conductive layers 218B-1/the first redistribution pads 218BP-1 and the first common sub package interconnectors 217-1B. In addition, the first chip stack 220 may be electrically connected to the first common pads 202-1C by a path that passes through the first common interconnectors 227C and the first common sub package interconnectors 217-1B. The first common pads 202-1C may be ground supply pads.

Similarly, the sub semiconductor chip 214 and the second chip stack 230 may be connected to the second common pads 202-2C. The second common pads 202-2C may be ground supply pads. In detail, the sub semiconductor chip 214 may be electrically connected to the second common pads 202-2C by a path that passes through the sub chip pads 215, the second redistribution conductive layers 218B-2/the second redistribution pads 218BP-2 and the second common sub package interconnectors 217-2B. In addition, the second chip stack 230 may be electrically connected to the second common pads 202-2C by a path that passes through the second common interconnectors 237C and the second common sub package interconnectors 217-2B.

Next, referring to FIGS. 4, 5, and 9, the first chip stack 220 and the sub semiconductor chip 214 may be electrically connected with each other by a path that passes through the sub chip pads 215, the first redistribution conductive layers 218B-1 and the first signal interconnectors 227A. In the case where the sub semiconductor chip 214 is a memory controller and the first main semiconductor chips 224 are memories, the respective first main semiconductor chips 224 may exchange signals/data with the outside through only the sub semiconductor chip 214. Accordingly, signals/data inputted to or outputted from the first main semiconductor chips 224 may be transferred through the path from the sub semiconductor chip 214.

Similarly, the second chip stack 230 and the sub semiconductor chip 214 may be electrically connected with each other by a path that passes through the sub chip pads 215, the second redistribution conductive layers 218B-2 and the second signal interconnectors 237A.

According to the semiconductor package described above, the same or similar effects as or to those described in the above embodiment may be achieved.

In addition, the first chip stack 220 or the second chip stack 230 is not connected to the sub semiconductor chip 214 through the substrate 200, but may be directly connected with the sub semiconductor chip 214 through the interconnectors 227A and 237A. Therefore, because the signal/data exchange path between the first chip stack 220 or the second chip stack 230 and the sub semiconductor chip 214 is short, an operation speed may be increased. Besides, because a circuit/wiring structure for connecting the first chip stack 220 or the second chip stack 230 and the sub semiconductor chip 214 in the substrate 200 is not necessary, the design of a circuit/wiring structure in the substrate 200 may be further simplified.

Figure 10:
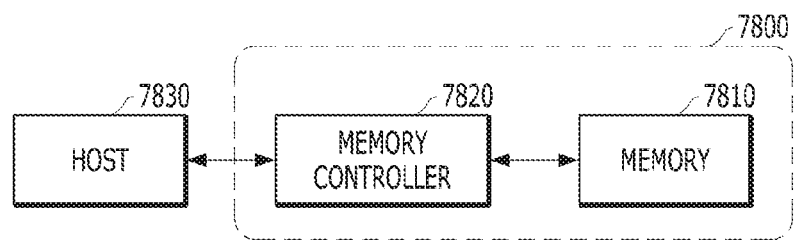
FIG. 10 shows a block diagram illustrating an electronic system employing a memory card including a semiconductor package, according to an embodiment.

FIG. 10 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 11:
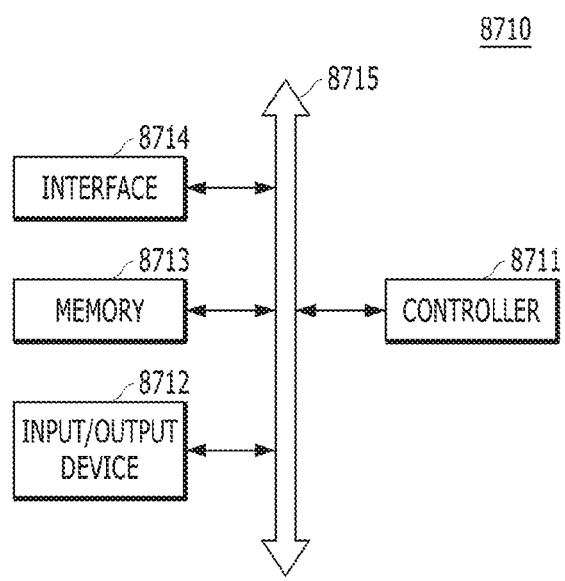
FIG. 11 shows a block diagram illustrating another electronic system including a semiconductor package, according to an embodiment.

FIG. 11 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the present teachings as defined in the following claims.

What is claimed is:
1. A semiconductor package comprising:
a substrate having first substrate pads formed at one side edge thereof in a first direction and second substrate pads formed at an other side edge thereof in the first direction;

a sub semiconductor package formed on the substrate, the sub semiconductor package including a sub semiconductor chip, a sub molding layer which surrounds side surfaces of the sub semiconductor chip, and redistribution conductive layers which extend onto the sub molding layer while being connected with sub chip pads of the sub semiconductor chip and are connected to first redistribution pads and second redistribution pads formed at one side edge and the other side edge, respectively, of the sub molding layer in the first direction;

a first chip stack formed on the sub semiconductor package, the first chip stack including one or more first main semiconductor chips; and a second chip stack formed on the first chip stack, the second chip stack including one or more second main semiconductor chips, wherein the sub semiconductor chip is connected to the substrate by first sub package interconnectors, which connect the first redistribution pads and the first substrate pads, and second sub package interconnectors, which connect the second redistribution pads and the second substrate pads, wherein the first chip stack is connected to the substrate by first interconnectors, which connect first chip pads of the one or more first main semiconductor chips and the first substrate pads, and wherein the second chip stack is connected to the substrate by second interconnectors, which connect second chip pads of the one or more second main semiconductor chips and the second substrate pads.

2. The semiconductor package according to claim 1, wherein the one or more first main semiconductor chips are offset-stacked in a direction facing away from the first substrate pads in the first direction, and the one or more second main semiconductor chips are offset-stacked in a direction facing away from the second substrate pads in the first direction.

3. The semiconductor package according to claim 2, wherein the first chip pads are disposed at one side edges of the first main semiconductor chips which are exposed according to offset-stacking of the one or more first main semiconductor chips, and the second chip pads are disposed at other side edges of the one or more second main semiconductor chips which are exposed according to offset-stacking of the second main semiconductor chips.

4. The semiconductor package according to claim 1, wherein those substrate pads among the first substrate pads which are connected with the first sub package interconnectors and are not connected with the first interconnectors or those substrate pads among the second substrate pads which are connected with the second sub package interconnectors and are not connected with the second interconnectors serve as power supply pads or signal transfer pads for the sub semiconductor chip.

5. The semiconductor package according to claim 1, wherein those substrate pads among the first substrate pads which are not connected with the first sub package interconnectors and are connected with the first interconnectors serve as power supply pads or signal transfer pads for the first chip stack, and those substrate pads among the second substrate pads which are not connected with the second sub package interconnectors and are connected with the second interconnectors serve as power supply pads or signal transfer pads for the second chip stack.

6. The semiconductor package according to claim 1, wherein those substrate pads among the first substrate pads which are connected in common to the first sub package interconnectors and the first interconnectors or those substrate pads among the second substrate pads which are connected in common to the second sub package interconnectors and the second interconnectors serve as ground supply pads.

7. The semiconductor package according to claim 6, wherein first ends of the first sub package interconnectors and first ends of the first interconnectors are in direct contact with the ground supply pads among the first substrate pads, and first ends of the second sub package interconnectors and first ends of the second interconnectors are in direct contact with the ground supply pads among the second substrate pads.

8. The semiconductor package according to claim 1, further comprising:

third interconnectors connecting the first chip pads and the first redistribution pads; and fourth interconnectors connecting the second chip pads and the second redistribution pads.

9. The semiconductor package according to claim 8, wherein those substrate pads among the first substrate pads which are electrically connected with the third interconnectors via the first sub package interconnectors and the first redistribution pads serve as ground supply pads, and those substrate pads among the second substrate pads which are electrically connected with the fourth interconnectors via the second sub package interconnectors and the second redistribution pads serve as ground supply pads.

10. The semiconductor package according to claim 8, wherein the third interconnectors are configured for signal exchange between the sub semiconductor chip and the first chip stack, and the fourth interconnectors are configured for signal exchange between the sub semiconductor chip and the second chip stack.

11. The semiconductor package according to claim 1, wherein the one or more first main semiconductor chips and the one or more second main semiconductor chips are memories, and the sub semiconductor chip is a memory controller.

12. The semiconductor package according to claim 1, wherein the sub chip pads include first sub chip pads and third sub chip pads which are disposed at both side edges, respectively, of the sub semiconductor chip in the first direction, and second sub chip pads and fourth sub chip pads which are disposed at both side edges, respectively, of the sub semiconductor chip in a second direction perpendicular to the first direction, the redistribution conductive layers which are connected with the first sub chip pads and the second sub chip pads extend to the first redistribution pads, and the redistribution conductive layers which are connected with the third sub chip pads and the fourth sub chip pads extend to the second redistribution pads.

13. The semiconductor package according to claim 12, wherein the redistribution conductive layers which are connected with the first sub chip pads have curved shapes, and
the redistribution conductive layers which are connected with the third sub chip pads have curved shapes.

14. The semiconductor package according to claim 13, wherein the redistribution conductive layers have a spiral shape centering on the sub semiconductor chip, when viewed from above.

15. The semiconductor package according to claim 1, wherein the sub semiconductor chip is positioned at a center part of the sub semiconductor package when viewed from above.

16. The semiconductor package according to claim 1, wherein the first chip stack and the second chip stack are disposed to expose the first redistribution pads and the second redistribution pads.

17. The semiconductor package according to claim 1, wherein the sub semiconductor package is disposed to expose the first substrate pads and the second substrate pads.

18. A semiconductor package comprising:
a substrate having first substrate pads formed at one side edge thereof in a first direction and second substrate pads formed at an other side edge thereof in the first direction;
a sub semiconductor package formed on the substrate, the sub semiconductor package including a sub semiconductor chip, a sub molding layer which surrounds side surfaces of the sub semiconductor chip, and redistribution conductive layers which extend onto the sub molding layer while being connected with sub chip pads of the sub semiconductor chip and are connected to first redistribution pads and second redistribution pads formed at one side edge and the other side edge, respectively, of the sub molding layer in the first direction; and
a chip stack formed on the sub semiconductor package, the chip stack including one or more main semiconductor chips,
wherein the sub chip pads include first sub chip pads and third sub chip pads which are disposed at both side edges, respectively, of the sub semiconductor chip in the first direction, and second sub chip pads and fourth sub chip pads which are disposed at both side edges, respectively, of the sub semiconductor chip in a second direction perpendicular to the first direction,
wherein the redistribution conductive layers which are connected with the first sub chip pads and the second sub chip pads extend to the first redistribution pads, and
wherein the redistribution conductive layers which are connected with the third sub chip pads and the fourth sub chip pads extend to the second redistribution pads.

19. The semiconductor package according to claim 18, wherein the redistribution conductive layers have a spiral shape centering on the sub semiconductor chip, when viewed from above.

20. The semiconductor package according to claim 18, wherein the sub semiconductor chip is positioned at a center part of the sub semiconductor package when viewed from above.

21. The semiconductor package according to claim 18, wherein
the first redistribution pads and the first substrate pads are connected with each other, and
the second redistribution pads and the second substrate pads are connected with each other.

* * * * *